(12) United States Patent
Cutuli et al.

(10) Patent No.: US 7,035,769 B2
(45) Date of Patent: Apr. 25, 2006

(54) DESIGN FAILURE MODE EFFECT ANALYSIS (DFMEA)

(75) Inventors: Giuseppe Cutuli, Catania (IT); Francesco Imperiale, Palermo (IT); Roberto Lissoni, Lissone (IT); Mario Marchese, Acicastello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/330,485

(22) Filed: Dec. 26, 2002

(65) Prior Publication Data

US 2004/0128108 A1 Jul. 1, 2004

(51) Int. Cl.
*G06F 17/30* (2006.01)
(52) U.S. Cl. .................... 702/185; 702/183; 702/187
(58) Field of Classification Search ........ 702/179–187, 702/58, 33–36, 59, 81–84, 113–115; 345/762–765, 345/769, 770, 661, 676, 771, 780, 901, 902, 345/961, 964–966, 968, 970; 700/97, 105, 700/121, 108–110, 117; 707/1, 3, 4; 714/1, 714/25, 26, 47, 46; 706/45, 908, 916, 919; 716/1, 4; 703/13, 14, 20, 21, 22
See application file for complete search history.

(56) References Cited

U.S. PATENT DOCUMENTS 5,109,380 A * 4/1992 Ogino ........................ 714/26
5,586,252 A * 12/1996 Barnard et al. ............... 714/48
6,094,649 A * 7/2000 Bowen et al. .................. 707/3
2002/0194219 A1* 12/2002 Bradley et al. ............. 707/506

OTHER PUBLICATIONS

Onodera, "Effective techniqes of FMEA at each life-cycle stage", Jan. 13-16 1997, IEEE, 1997 Proceedings, Annual Reliability and Maintainability Symposium, pp. 50-56.*

* cited by examiner

*Primary Examiner*—Hal Wachsman
(74) *Attorney, Agent, or Firm*—Lisa K. Jorgenson; Robert Iannucci; Seed IP Law Group PLLC

(57) ABSTRACT

A Design Failure Mode Effect Analysis (DFMEA) method analyzes faults and failures in the design phase of electronic devices. A data-entry mask is used for recording some information concerning the performed analysis and a portion of the recording form is displayed to a user in an electronic display format. The method detects and records past design problems and their corresponding solutions, by a DFMEA method using the data-entry mask form; associates keywords in a database with each problem; associates data concerning each of the design problems, in the same database, including information concerning past fails occurred in similar applications; detects major changes and/or innovations, as well as any improved block or part of a new device with respect to other devices, thereby postulating possible new problems introduced by the new device; and records the new problems and their possible solutions, by the DFMEA method and using the form.

6 Claims, 7 Drawing Sheets

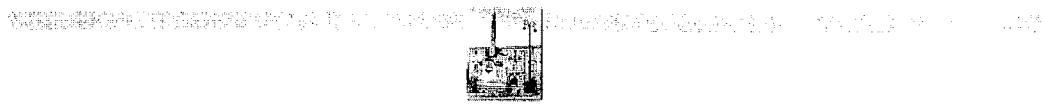
| DFMEA NUMBER | ACTIVITY | RESPONSIBLE | RELATED DEVICE |
|---|---|---|---|
| DFMEA-A4A0 | Design in Progress | imperiale francesco | M28W160B (A4A0 - 16Mbit - CmosT7) |
Edit Current Settings | Open This Pr
Create a new DFMEA Project
Fig. 1

Potential Failure Mode and Effect Analisys

DIVISION: [MPG ▼]   IDFMEA ID-Code: [-- All -- ▼]   REVISION: [-- All -- ▼]   DATE REVISION: [ ▼]

ACTIVITY: [-- All -- ▼]   FRONT-END LOCAT: [-- All -- ▼]   DESIGN LOCAT: [-- All -- ▼]

| Item/ Function | Potential Failure Mode | Potential Effect of Failure | CLASS | Potential Cause/ Mechanism of Failure | Current Control | RPN | Recommended Action | Target Completion | Action Taken | RPN |
|---|---|---|---|---|---|---|---|---|---|---|
| [-- All -- ▼] | | | [-- All -- ▼] | | | | [-- All -- ▼] | [-- All -- ▼] | | |

[Search] [Help] [Reset] [Back]

STMicroelectronics Company Confidential

Potential Failure Mode and Effect Analisys

DFMEA ID-Code: DFMEA-A4A0  REVISION: C  DATE REVISION: 21-11-2000

ACTIVITY: Design in Progress  FRONT-END LOCAT: CATANIA-AGRATE  DESIGN LOCAT: AGRATE CORE TEAM: T7 GROUP  COMPONENTS:
- carmelo condemi (PROJECT LEADER)
- mario marchese (DESIGNER)
- pietro sudano (PRODUCT ENG.)
- roberto lissoni (DESIGNER)
- francesco imperiale (DESIGNER)
- fabio morgana (PRODUCT ENG.)

| Item/Function | Potential Failure Mode | Potential Effect of Failure | C L A S S | S E V | Potential Cause/ Mechanism of Failure | O C C | Current Control | D E T | R P N | Recommended Action | Responsable and target completion date | Action Taken | S E V | O C C | D E T | R P N |
|---|---|---|---|---|---|---|---|---|---|---|---|---|---|---|---|---|
| PROGRAMMING Program reference cell (REF_CELLS) | Softprogram of the program reference cell | Failure for erase tune | A | 8 | Capacitive coupling between the VYP node and the drain of the reference cell that is floating during the execution of some instructions in | 8 | none | 10 | 640 | DETECTABILITY: 1) To perform an eldo simulation of the reference cells giving a ramp voltage to VYP (from 4v to 8.75v) and to check the voltage of the drain of the reference cell. 2) In | francesco imperiale TO BE VALIDATED 21-11-2000 | DETECTABILITY: 1) To perform an eldo simulation of the reference cells giving a ramp voltage to VYP (from 4v to 8.75v). In this and checking the voltage of the drain of the reference cells. 2) In testing, to perform a cycling with program | 8 | 1 | 2 | 16 |

FIG. 3B

| A | B | C | D E F | G H | I J | K | L | M | N O P Q R |
|---|---|---|---|---|---|---|---|---|---|
| EWS—BINNING Row short fails. | The Fails have got the following features: 1. Whole rows don't pass ReadAll1s 2. The fail bits has got a drain current equal to zero (whatever are the gate and drain voltages) 3. There are no bitlineleakage fails. | | program UM. ☐ Details | | | testing to perform a cycling with program and erase UM. OCCURRENCY: 1) To modify the algorithm in such a way that the time when the program reference remain floating is lower. 2) To put to gnd the drain of the reference when the VYP node goes up. ☐ Schematics... SEVERITY: | DETECTABILITY: fabio morgana OCCURRENCY: --??-- SEVERITY: 12-01-2001 | and erase UM OCCURRENCY: 1) To modify the algorithm in such a way that the time when the program reference remain floating is lower. ☐ Simulation... SEVERITY: DETECTABILITY: OCCURRENCY: SEVERITY: | |
| | | | | | 0 | | | | |

Potential Failure Mode and Effect Analisys

DFMEA Number: DFMEA-A4A0
Activity: Design in Progress
Responsible: IMPERIALE FRANCESCO
Device Info: M28W160B (A4A0) 16Mbit - CmosT7

Rev. ID: C 7
Rev. Date: 21-11-2000
Rev. Status: EDITABLE
Rev. Protection: PRIVATE Freeze Rev | Chg Protection
View DFMEA
Gen. Package
Readers Man
Inpack

DESIGN FAILURE MODE EFFECT ANALYSIS (DFMEA)

BACKGROUND OF THE INVENTION

1. Field of the Invention

The present invention broadly relates to a method of analyzing faults and failures in the design of electronic apparatus and devices.

More specifically, the invention relates to a method wherein a DFMEA form or document is used for analyzing faults and failures in the design of electronic apparatus and devices, the DFMEA form including a data-entry mask through which information concerning the analysis are recorded and in which at least a portion of the document is displayed to a user in an electronic display format.

2. Description of the Related Art

As is well known in this technical field, one of the best appreciated and widely used techniques for preventing faults and/or errors in the design of apparatus and/or devices for automotive applications is a method commonly referred to by the acronym FMEA (Failure Mode Effect Analysis).

This method or technique was developed in the States for the automotive industry, but soon spread to the suppliers of the US automotive manufacturers.

In the FMEA technique, under the guidance of a predetermined form to be filled, the user is directed to identify possible weakness areas in a product or a process, and this especially at the initial development stage.

There are two main divisions in the FMEA technique: a first division covers industrial processes and is known as PFMEA (Process FMEA); a second division is specific to the design of new parts and/or devices and known as DFMEA (Design FMEA).

The analysis is conducted by means of a form divided into two sections, as specified here below.

A right-side section is devoted to illustrate a potential problem by the following entries:

Item/Function: identifies the part affected by the problem;

Potential Failure Mode: indicates a failure mode;

Effect of Failure: is the failure mode effect on the application and operation;

Root Cause: is the prime cause that originated the failure mode; and

Current Control: is an existing control for finding the failure mode.

Consort with these entries of a descriptive nature are three columns that are used for weighing the degree of risk that associates with each entry. The weight marks may be, for example:

S (Severity), to provide a measure of how severe the failure mode effect is;

O (Occurrence), to quantify the rate at which the failure mode is generated; and D (Detectivity), to detect the location within the control chain where the failure mode can be found.

All these marks carry a value scale from 1 to 10, with 1 being the lowest and 10 the highest degree of risk.

On completion of a preliminary analysis, a Risk Product Number (RPN) is arrived at by multiplying the marks S, O, D together, this number indicating the degree of risk that associates with the potential failure mode detected.

When RPN exceeds a given threshold value, corrective actions must be taken to bring it down.

The second section of the form, which is reserved for the last-mentioned entry, comprises:

Recommended Action: the action proposed in order to bring RPN down;

Responsible and Completion Date: the responsible entity for the action and the action completion date; and Action Taken: the action actually completed.

The three columns labeled S, O and D and to be re-calculated after completion of the corrective action specified, should be added to these columns.

The FMEA technique outlined above has gained widespread acceptance in the semiconductor industry. However, this is an industry devoted to the production of highly complex devices whose component parts to be analyzed may be millions.

The FMEA technique has been perfected under the concurrent urge of quality requirements enforced by a number of protocols, such as the QS9000 protocol.

Initially, the PFMEA technique grew in popularity, while the other DFMEA technique was only occasionally applied, but later the DFMEA technique would prove to be the more useful and profitable for the manufacturer. The few examples in existence only regard its use at meetings, or to fill demands arising from auditing operations or the like scrutinizing operations.

The reasons for this initial lack of interest in the DFMEA technique are summarized here below.

Any attempt to apply a DFMEA technique based upon the potential failure modes of individual elements included into a complex device is unthinkable and Utopian. Even a potential demand from clients and quality control groups missed to reflect the practical difficulties faced by the designer.

Even if one or more component parts were analyzed, the reference grid for reckoning the S, O, D marks would approach a process analysis in a fashion far too sweeping, thereby occasioning interpretation difficulties making the reckoning ineffective.

The types of information that describe the aforementioned fields (e.g., Action Taken, Potential Failure Mode, etc.) often require that detailed descriptions and attendant graphs, diagrams, etc., be submitted which are impossible to abridge in a text like the one provided for in the known form. The suggestion to give a numeral reference to technical reports makes their retrieval a difficult, laborious and inefficient task, so that people are discouraged from attempting to read and understand a DFMEA.

The environment where the DFMEA technique was originally developed is that of an international holding where similar devices, potentially sharing the same recurrent problems, are frequently developed by different designing departments residing in different, towns, territories, or nations.

To summarize, while being advantageous on several counts, the DFMEA technique has limitations that delay its application by the designers of electronic apparatus and devices. Of these limitations, the following are more heavily felt:

current rules that cannot be applied to highly complex devices;

reference grids for the S, O, D mark that do not match the designing criteria;

no provisions for the inclusion of technical information in a text; and information that is difficult to have circulated through all the product development teams involved.

BRIEF SUMMARY OF THE INVENTION

An embodiment of this invention provides a novel method for applying the DFMEA technique, which method exhibits appropriate functional features to overcome the drawbacks and limitations of the prior art previously discussed.

The method provides the users of the DFMEA technique with an innovative tool for handling and utilizing the results of analytical activity.

The method provides an innovative approach of the DFMEA technique by shifting the objective from that of preventing the occurrence new faults, typical of the prior art approaches, to that of preventing the reappearance of problems already encountered in the past.

The invention relates to a DFMEA method of analyzing faults and failures in the design of electronic apparatus and devices, wherein an information recording form including a data-entry mask is used for recording some information concerning the performed analysis and in which at least a portion of said recording form is displayed to a user in an electronic display format. The method includes:

detecting and recording past design problems and their corresponding solutions, by a DFMEA method using the form;

associating keywords in a database with the problems as individual functions;

associating data concerning each of the design problems, in the same database, including information concerning past fails occurred in similar applications;

detecting major changes and/or innovations, as well as any improved block or part of a new device with respect to other devices, thereby postulating possible new problems introduced by the new device; and recording the new problems and their possible solutions, by the DFMEA method and using the form.

The invention further relates to a DFMEA form or document device for analyzing faults and failures in the design of electronic apparatus and devices. A data-entry mask is provided to record some information concerning the performed analysis and at least a portion of the recording form is displayed to a user in an electronic display format. The portion includes at least one pushbutton or link button for connection to a file-associating tool that attaches electronic format files concerning the information to be entered through the mask.

The features and advantages of the method and the document device according to the invention will become apparent from the description of embodiments thereof, given by way of non-limiting examples with reference to the accompanying drawings.

BRIEF DESCRIPTION OF THE SEVERAL VIEWS OF THE DRAWINGS

FIG. 1 shows a schematic example of a display mask for a data selection and entry form implementing the inventive method;

FIG. 2 shows a schematic example of a more detailed display mask allowing the user to enter the initial data and information concerning a DFMEA project according to the inventive method;

FIGS. 3A and 3B summarize in tabular form the information made available by the form of FIG. 2;

FIG. 4 is a schematic view of a portion of a data-entry mask provided by the inventive form;

FIG. 5 is a schematic view of another portion of a data-entry mask provided by the inventive form;

DETAILED DESCRIPTION OF THE INVENTION

Figure 6:
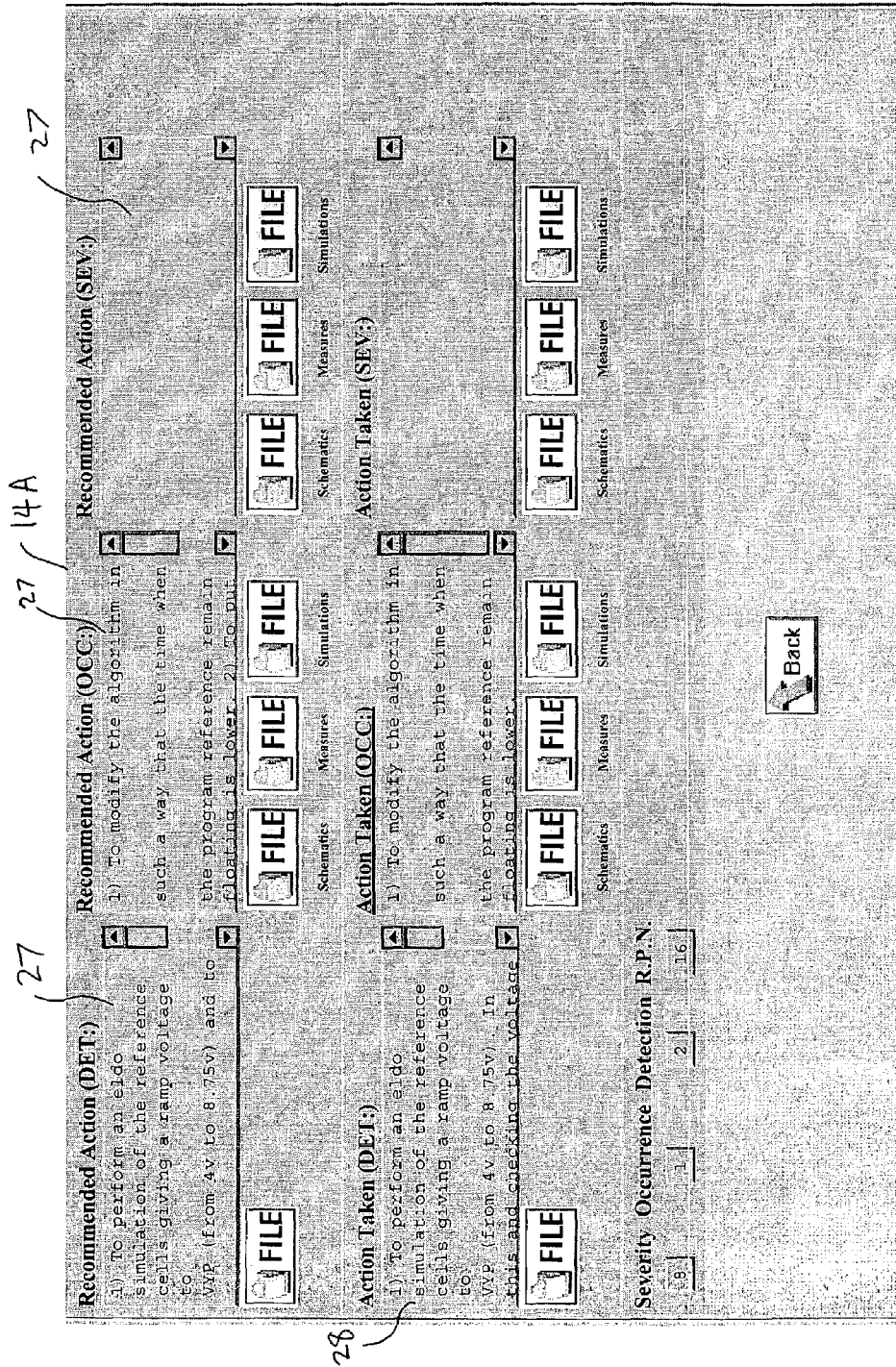
FIG. 6 is a schematic view of a continuation portion of the data-entry mask shown in FIG. 5.

In the drawing views, a display mask of a data and information recording system implementing the DFMEA fault and failure analysis method is generally shown at 1. The recording system is mainly used in designing electronic apparatus and devices.

The mask 1 can be viewed as the initial representation of certain controls adapted to interact with a database wherein the items of information gathered by the analysis method of this invention are stored as they become available.

More particularly, shown in the example of FIG. 1 is a portion of a starting form or document device 3. This form is provided preferably in an electronic display format, although there is no reason why it could not be provided on another type of support, e.g., a paper support.

The form 3 is derived from a typical DFMEA form, but has been modified in a qualifying manner according to this invention. More particularly, shown schematically in FIG. 2 is the construction of a data entering portion 2 of the DFMEA form 3 according to the invention. This entering portion 2 is accessed selecting the choice "Create a new DFMEA project" in FIG. 1.

The portion 2 includes a grid 4 that includes a portion 5 of increasing severity for each parameter, block, or device that allows to select the item or function under analysis. Then, at least three potential failure levels may be indicated and namely: a general failure more; the effect of the failure and the potential cause or mechanism of the failure.

Three additional levels dependent on the number of impacted applications; and namely: a current control; a recommended action and the action taken.

The FIGS. 3A and 3B report an example of a possible filled-in entering portion 2.

The features of each form 3 will now be reviewed in greater detail.

1) The form 3 can be accessed from computer systems used to interconnect electronic processors, e.g., on an intranet network that can be accessed from any authorized peripheral units of a company.

2) Access to each form 3 is controlled by a special password level that allows some of the information to be accessed for reading or writing, depending on the password level that has been allocated.

3) A form-dedicated search motor can extract information from all the DFMEA forms in existence to place it at the user's disposal.

As shown in FIG. 1, each form 3 has an entry mask 10, preferably in the PDF format, although alternative formats may be used for the same purposes. The entry mask 10 has two entry levels, namely:

a first level 11 for accessing projects that have been previously authorized; and a second level 12 for accessing the search engine.

The procedure for accessing either levels will now be described briefly.

First level: once a special password is edited, the appropriate FMEA can be filled in by means of an "edit current settings" control; in order to make changes to the user levels and the document protection, an "open this project" control is used for editing the DFMEA document. The mask 15 of FIG. 4 is accessed by the "open this project" command and will now be described in greater detail:

The mask 15 is divided into two portions 13, 14. The portion 13 overhead allows the characteristics of the document to be set by filling it with the following series of information items:

personal information 19;

revision date 16;

status 17 (either editable or freezed, according to whether in progress or freezed);

protection levels 18, for any reserved accesses to a prearrangeable list (Readers Man).

Three pushbutton controls are also accessible in portion 13 of the mask 15, which serve the following functions:

View FMEA: allows the document to be edited in the html format, with a prearranged layout of pages, where data about the project and the project team is entered; the tabular format of this utility is shown in FIG. 4 along with all the items concerned;

Gen Package: allows the document to be compacted, and its files consolidated into a single file;

Readers Man: allows the document to be accessed to a pre-reserved list.

The portion 14 underneath makes the DFMEA easy to fill in, and allows files to be attached as may be found necessary in order to furnish the user with all the technical details of concern.

Figure 5:
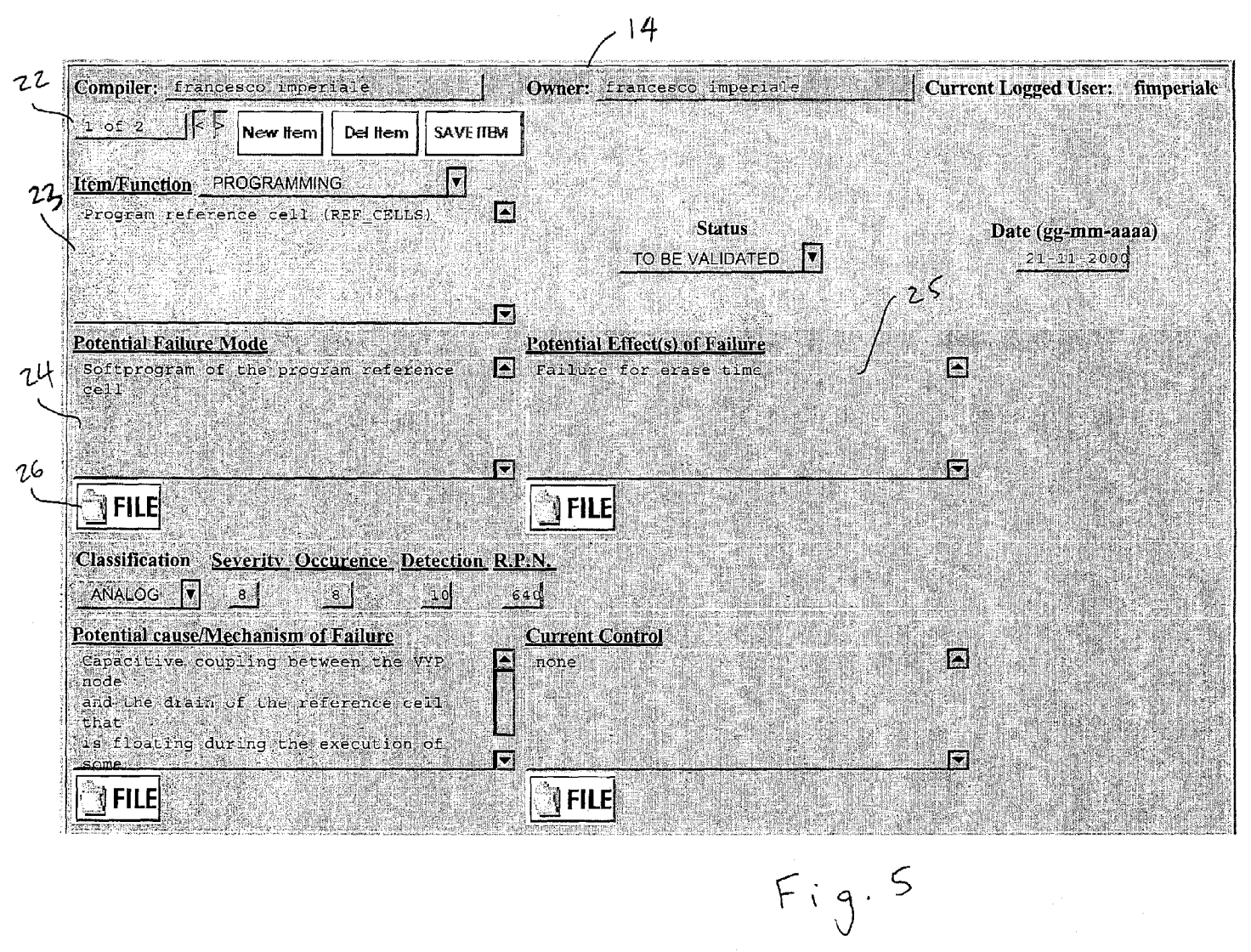

With reference to FIG. 5, it can be seen that the portion 14 of the mask 15 comprises:

an "Item" section 22 to set the line of the DFMEA form that is to be edited (e.g., 1 of 2);

an "Item/Function" section 23 to set the block or the function of the device affected by the fail mode; this field is preset since it is to be searched by the dedicated engine;

a "Potential Failure Mode" section 24 and a "Potential Effects of Failure" section 25, which are also provided for by standard FMEA; and a "File" section 26 including a pushbutton for connection to the item that has been described briefly in text form; this pushbutton allows a file, report, schematics, picture, or whatever else may be necessary to understand the item, to be attached. The formats of the attached files may be any desired types, including the .pdf, .html, gif, jpeg, txt, and tar formats.

Shown in FIG. 6 is a continuation portion 14A of the mask 15, which portion 14A could not be represented in one diagram for page layout reasons.

This continuation portion 14A includes a plurality of "Recommended Actions" sections 27. A text description of the recommended actions can be appended a file that may be any of three different types, such as the following:

Schematics, Measures, or Simulations, according to the type of information that is entered.

A following section 28 allows the types of the actions actually taken to be recorded. The section 28 can be attached a file, classed by the type, similar as section 27.

Once the "File" part is accessed, the system allows all the files present in the processor to be accessed and displayed using a conventional browse function.

After a file is selected, the system allows it to be attached to the respective DFMEA area of origin, i.e., the area in which the files had been accessed by the "File" pushbutton.

Once all the items to be entered to the DFMEA are saved, and the respective files attached, the document is recorded at its dedicated DFMEA location.

To fight faults that have already been analyzed in connection with previous projects, it is important that different users be timely made aware of any problems encountered, for example, with devices, processes, or projects, as well as of their failure modes.

How the information is handled within each form 3 will now be explained. Besides handling information, the form 3 allows the informational contents of various DFMEAs to be shared and retrieved.

The method of this invention provides a few innovative guidelines to the implementation of a DFMEA technique by means of the form 3 just described. These guidelines are listed here below:

1) detecting and recording, by the DFMEA method on the form 3, previously encountered problems and their solutions, by the application of a keyword analysis at a function and/or keyword level;

2) taking into account all past application failures occurred in similar applications; and 3) analyzing major changes and/or innovations, and any integration of blocks or parts, undergone by a new device from other devices, in order to foresee any potential occurrence of new problems in the new device.

At least three revisions of the DFMEA form are envisaged, corresponding to as many stages of maturity of the new device. In a preferred embodiment, three revisions are provided as listed here below:

a) Design;

b) Qualification; and c) Production—Post-qualification.

For greater convenience in searching previous records and entering new data, a search motor is provided in which all the fields are present that may become the targets of a possible search criterion; some fields are pre-filled in and show a list of possible items, while other fields are left blank.

Once a search criterion is keyed in, the system extracts those items which correspond to the selected search criterion, along with any files attached thereto, from all the existing DFMEA records.

Using the search motor, a DFMEA by the function/block can be formed from existing data in the system.

In this way, a user on the point of designing an electrostatic discharge (ESD) protection block, for example, can obtain in DFMEA format the history of problems encountered with common products or processes and the solutions provided, with the addition of any appropriate technical topics concerning modified schematic files, simulations devised, measurements made, etc.

The method described above affords a number of advantages among which are:

1) a new approach to the use of the DFMEA technique so as to avoid the re-occurrence of events in a fail-prevention environment;

2) shared DFMEA information in a dedicated web environment;

3) efficient handling of the DFMEA form, by providing file linking facilities for attaching technical information and enhancing the document usefulness; and this in a web environment fill-in system wherein the document control and access rules are implemented automatically;

4) information access and flow controlled at various read/write levels using a search motor that is detailed and layered to utilize the informational contents so as to avoid re-occurrence of problems; and 5) DFMEA implemented by the key block/function.

The U.S. provisional patent application listed in the Application Data Sheet, namely U.S. provisional patent application No. 60/343,873 filed on Dec. 26, 2001, is incorporated herein by reference, in its entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A design failure mode effect analysis (DFMEA) method of analyzing faults and failures in the design of electronic apparatus and devices, wherein an information recording form including a data-entry mask is used for recording some information concerning the performed analysis and in which at least a portion of said recording form is displayed to a user in an electronic display format; the method comprising:
   detecting and recording past design problems and corresponding solutions to the past design problems using said recording form;
   associating keywords in a database to each said past design problems as individual functions;
   associating data concerning each of said past design problems, in the same database, including information concerning past fails that occurred in similar applications;
   detecting major changes and/or innovations, as well as any improved block or part of a new device with respect to other devices, thereby postulating possible new problems introduced by the new device; and
   recording said new problems and possible solutions to said new problems using said recording form.

2. A method according to claim 1, comprising at least three revisions of the recording form corresponding to maturity stages of said new device.

3. A method according to claim 2, wherein said at least three revisions are performed at the following stages:
   design of the new device;
   qualification of the new device; and
   production of the new device post—qualification.

4. A design failure mode effect analysis (DFMEA) method for analyzing failures in an initial design phase of electronic apparatuses and/or devices, the DFMEA method comprising:
   recording in a data-entry mask some information concerning the analysis and wherein a portion of said data-entry mask is displayed to a user;
   detecting and recording, using said data-entry mask, past design problems and possible corresponding solutions;
   recording keywords in a database associating each of said past design problems to a corresponding keyword;
   associating data in the same database concerning each of said past design problems, including information concerning past failures that occurred in similar applications;
   detecting major changes and/or innovations of the electronic apparatuses and/or devices and defining new possible problems introduced by the electronic apparatuses and/or devices; and
   recording said new possible problems and possible solutions to said new possible problems using said data-entry mask.

5. A method according to claim 4, comprising at least three revisions of the data-entry mask corresponding to maturity stages of said designed apparatus or device.

6. A method according to claim 5, wherein said at least three revisions are performed at the following stages:
   design of the designed apparatus or device;
   qualification of the designed apparatus or device; and
   production of the designed apparatus or device—post-qualification.

* * * * *

UNITED STATES PATENT AND TRADEMARK OFFICE
CERTIFICATE OF CORRECTION

| | |
|---|---|
| PATENT NO. | : 7,035,769 B2 |
| APPLICATION NO. | : 10/330485 |
| DATED | : April 25, 2006 |
| INVENTOR(S) | : Giuseppe Cutuli et al. |

It is certified that error appears in the above-identified patent and that said Letters Patent is hereby corrected as shown below:

Title Page,

Item [63], should read as --this application claims benefit of provisional application No. 60/343,873, filed on December 26, 2001.--

Signed and Sealed this

Twentieth Day of February, 2007

JON W. DUDAS
*Director of the United States Patent and Trademark Office*